US008140936B2

(12) United States Patent  (10) Patent No.: US 8,140,936 B2
Gower et al.  (45) Date of Patent: Mar. 20, 2012

(54) SYSTEM FOR A COMBINED ERROR CORRECTION CODE AND CYCLIC REDUNDANCY CHECK CODE FOR A MEMORY CHANNEL

(75) Inventors: Kevin C. Gower, LaGrangeville, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 1092 days.

(21) Appl. No.: 12/018,926

(22) Filed: Jan. 24, 2008

(65) Prior Publication Data
US 2009/0193315 A1 Jul. 30, 2009

(51) Int. Cl.
*H03M 13/00* (2006.01)
(52) U.S. Cl. ......... 714/758; 714/763; 714/6.24; 714/48; 714/746; 714/751; 714/764
(58) Field of Classification Search .................. None
See application file for complete search history.

(56) References Cited

U.S. PATENT DOCUMENTS

| | | |
|---|---|---|
| 5,367,643 A | 11/1994 | Chang et al. |
| 5,386,540 A | 1/1995 | Young et al. |
| 5,513,135 A | 4/1996 | Dell et al. |
| 5,598,113 A | 1/1997 | Jex et al. |
| 5,640,349 A | 6/1997 | Kakinuma et al. |
| 5,867,731 A | 2/1999 | Williams et al. |
| 5,887,272 A | 3/1999 | Sartore et al. |
| 5,896,404 A | 4/1999 | Kellogg et al. |
| 6,049,476 A | 4/2000 | Laudon et al. |
| 6,095,827 A | 8/2000 | Dutkowsky et al. |
| 6,109,929 A | 8/2000 | Jasper |
| 6,141,728 A | 10/2000 | Simionescu et al. |
| 6,263,448 B1 | 7/2001 | Tsern et al. |
| 6,279,072 B1 | 8/2001 | Williams et al. |
| 6,285,622 B1 | 9/2001 | Haraguchi et al. |
| 6,356,500 B1 | 3/2002 | Cloud et al. |

(Continued)

FOREIGN PATENT DOCUMENTS
WO WO 99/49468 9/1999

OTHER PUBLICATIONS
U.S. Appl. No. 11/848,309.

(Continued)

*Primary Examiner* — John Trimmings
(74) *Attorney, Agent, or Firm* — Francis Lammes; Stephen J. Walder, Jr.; Diana R. Gerhardt

(57) ABSTRACT

A memory system is provided that performs error correction at a memory device level. The memory system comprises a memory hub device integrated in the memory module and a link interface integrated in the memory hub device that provides a communication pathway between the memory hub device and an external memory controller. The link interface comprises first error correction logic integrated in the link interface that performs error correction operations on first data that is received from the external memory controller via a first memory channel to be transmitted to a set of memory devices. The first error correction logic generates a first error signal to the external memory controller in response to the first error correction logic detecting a first error in the first data. Link interface control logic integrated in the link interface controls the transmission of the first data to the set of memory devices.

20 Claims, 5 Drawing Sheets

U.S. PATENT DOCUMENTS

| | | |
|---|---|---|
| 6,397,287 B1 | 5/2002 | Brown et al. |
| 6,397,290 B1 | 5/2002 | Williams et al. |
| 6,401,149 B1 | 6/2002 | Dennin et al. |
| 6,415,349 B1 | 7/2002 | Hull et al. |
| 6,418,068 B1 | 7/2002 | Raynham |
| 6,477,614 B1 | 11/2002 | Leddige et al. |
| 6,507,887 B1 | 1/2003 | Pontius et al. |
| 6,512,644 B1 | 1/2003 | Hall et al. |
| 6,584,543 B2 | 6/2003 | Williams et al. |
| 6,683,372 B1 | 1/2004 | Wong et al. |
| 6,721,864 B2 | 4/2004 | Keskar et al. |
| 6,779,055 B2 | 8/2004 | Kim et al. |
| 6,785,837 B1 | 8/2004 | Kilmer et al. |
| 6,789,169 B2 | 9/2004 | Jeddeloh |
| 6,821,144 B2 | 11/2004 | Choy |
| 6,822,960 B1 | 11/2004 | Manchester et al. |
| 6,848,060 B2 | 1/2005 | Cook et al. |
| 6,889,284 B1 | 5/2005 | Nizar et al. |
| 6,910,145 B2 | 6/2005 | MacLellan et al. |
| 6,938,119 B2 | 8/2005 | Kohn et al. |
| 6,944,737 B2 | 9/2005 | Ahn et al. |
| 6,952,745 B1 | 10/2005 | Dodd et al. |
| 6,961,281 B2 | 11/2005 | Wong et al. |
| 6,982,892 B2 | 1/2006 | Lee et al. |
| 6,990,552 B2 | 1/2006 | Abdat |
| 6,996,766 B2 | 2/2006 | Cypher |
| 7,017,002 B2 | 3/2006 | Perego et al. |
| 7,043,611 B2 | 5/2006 | McClannahan et al. |
| 7,054,179 B2 | 5/2006 | Cogdill et al. |
| 7,103,730 B2 | 9/2006 | Saxena et al. |
| 7,111,143 B2 | 9/2006 | Walker |
| 7,114,117 B2 | 9/2006 | Tamura et al. |
| 7,117,328 B2 | 10/2006 | Shibuya et al. |
| 7,117,421 B1 | 10/2006 | Danilak |
| 7,120,727 B2 | 10/2006 | Lee et al. |
| 7,124,332 B2 | 10/2006 | Constantinescu |
| 7,133,972 B2 | 11/2006 | Jeddeloh |
| 7,143,246 B2 | 11/2006 | Johns |
| 7,162,669 B2 | 1/2007 | Gross |
| 7,200,021 B2 | 4/2007 | Raghuram |
| 7,200,023 B2 | 4/2007 | Foster, Sr. |
| 7,203,874 B2 | 4/2007 | Roohparvar |
| 7,210,015 B2 | 4/2007 | Barth et al. |
| 7,216,196 B2 | 5/2007 | Jeddeloh |
| 7,225,303 B2 | 5/2007 | Choi |
| 7,234,099 B2 | 6/2007 | Gower et al. |
| 7,269,042 B2 | 9/2007 | Kinsley et al. |
| 7,272,070 B2 | 9/2007 | Hummler |
| 7,386,649 B2 | 6/2008 | Jeddeloh et al. |
| 7,386,768 B2 | 6/2008 | Vogt et al. |
| 7,487,428 B2 | 2/2009 | Co et al. |
| 7,490,209 B1 | 2/2009 | Charagulla |
| 7,523,248 B2 | 4/2009 | Perego et al. |
| 7,526,597 B2 | 4/2009 | Perego et al. |
| 7,539,842 B2 | 5/2009 | Tremaine |
| 7,558,124 B2 | 7/2009 | Wu et al. |
| 7,558,887 B2 | 7/2009 | Gower et al. |
| 7,562,271 B2 | 7/2009 | Shaeffer et al. |
| 7,577,039 B2 | 8/2009 | Yang et al. |
| 7,584,308 B2 | 9/2009 | Gower et al. |
| 7,584,336 B2 | 9/2009 | Tremaine |
| 7,610,430 B2 | 10/2009 | Jeddeloh |
| 7,636,833 B2 | 12/2009 | Tremaine |
| 7,644,347 B2 | 1/2010 | Alexander et al. |
| 7,734,980 B2 | 6/2010 | Alexander et al. |
| 7,770,077 B2 | 8/2010 | Arimilli et al. |
| 7,774,559 B2 | 8/2010 | Cronin et al. |
| 7,788,451 B2 | 8/2010 | Larson et al. |
| 7,882,423 B2 | 2/2011 | Wang et al. |
| 7,900,100 B2 | 3/2011 | Gollub |
| 2002/0112119 A1 | 8/2002 | Halbert et al. |
| 2003/0037280 A1 | 2/2003 | Berg et al. |
| 2003/0061447 A1 | 3/2003 | Perego et al. |
| 2003/0097526 A1 | 5/2003 | Chiu et al. |
| 2003/0137862 A1 | 7/2003 | Brunelle et al. |
| 2004/0006674 A1 | 1/2004 | Hargis et al. |
| 2004/0024971 A1 | 2/2004 | Bogin et al. |
| 2004/0109468 A1 | 6/2004 | Anjanaiah |
| 2004/0117566 A1 | 6/2004 | McClannahan et al. |
| 2004/0128464 A1 | 7/2004 | Lee et al. |
| 2004/0213074 A1 | 10/2004 | Johnson et al. |
| 2004/0236877 A1 | 11/2004 | Burton |
| 2005/0033921 A1 | 2/2005 | Jeddeloh |
| 2005/0050255 A1 | 3/2005 | Jeddeloh et al. |
| 2005/0125702 A1 | 6/2005 | Huang et al. |
| 2005/0138267 A1 | 6/2005 | Bains et al. |
| 2005/0138302 A1 | 6/2005 | Lusk et al. |
| 2005/0160250 A1 | 7/2005 | Yoshimi |
| 2005/0216677 A1 | 9/2005 | Jeddeloh et al. |
| 2005/0223161 A1 | 10/2005 | Jeddeloh et al. |
| 2005/0278495 A1 | 12/2005 | Lee |
| 2006/0047899 A1 | 3/2006 | Ilda et al. |
| 2006/0095592 A1 | 5/2006 | Borkenhagen |
| 2006/0117322 A1 | 6/2006 | Gimness et al. |
| 2006/0123261 A1 | 6/2006 | Riley et al. |
| 2006/0136618 A1* | 6/2006 | Gower et al. .................. 710/52 |
| 2006/0158917 A1 | 7/2006 | Bartley et al. |
| 2006/0168407 A1 | 7/2006 | Stern |
| 2006/0179262 A1 | 8/2006 | Brittain et al. |
| 2006/0212775 A1 | 9/2006 | Cypher |
| 2006/0235901 A1 | 10/2006 | Chan |
| 2006/0245226 A1 | 11/2006 | Stewart |
| 2006/0271755 A1 | 11/2006 | Miura |
| 2006/0288132 A1 | 12/2006 | McCall et al. |
| 2006/0288177 A1 | 12/2006 | Shaw |
| 2007/0005922 A1 | 1/2007 | Swaminathan et al. |
| 2007/0011392 A1 | 1/2007 | Lee et al. |
| 2007/0011562 A1 | 1/2007 | Alexander et al. |
| 2007/0016718 A1 | 1/2007 | Radhakrishnan et al. |
| 2007/0033317 A1 | 2/2007 | Jeddeloh et al. |
| 2007/0050530 A1 | 3/2007 | Rajan |
| 2007/0098020 A1 | 5/2007 | Ja et al. |
| 2007/0106860 A1 | 5/2007 | Foster et al. |
| 2007/0111606 A1 | 5/2007 | Goodwin |
| 2007/0150672 A1 | 6/2007 | Alexander et al. |
| 2007/0162648 A1 | 7/2007 | Tousek |
| 2007/1016265 | 7/2007 | Miwa |
| 2007/0230230 A1 | 10/2007 | Hofstra |
| 2007/0260841 A1 | 11/2007 | Hampel et al. |
| 2008/0022186 A1* | 1/2008 | Co et al. ........................ 714/763 |
| 2008/0031030 A1 | 2/2008 | Rajan et al. |
| 2008/0046666 A1 | 2/2008 | Termaine |
| 2008/0170425 A1 | 7/2008 | Rajan |
| 2008/0215792 A1 | 9/2008 | Jeddeloh |
| 2008/0270741 A1 | 10/2008 | Tremaine |
| 2008/0276032 A1* | 11/2008 | Iida et al. ....................... 710/316 |
| 2009/0019195 A1 | 1/2009 | Djordjevic |
| 2009/0063729 A1 | 3/2009 | Gower et al. |
| 2009/0063730 A1 | 3/2009 | Gower et al. |
| 2009/0063731 A1 | 3/2009 | Gower et al. |
| 2009/0063761 A1 | 3/2009 | Gower et al. |
| 2009/0063784 A1 | 3/2009 | Gower et al. |
| 2009/0063785 A1 | 3/2009 | Gower et al. |
| 2009/0063787 A1 | 3/2009 | Gower et al. |
| 2009/0063922 A1 | 3/2009 | Gower et al. |
| 2009/0063923 A1 | 3/2009 | Gower et al. |
| 2009/0125788 A1 | 5/2009 | Wheeler et al. |
| 2009/0190427 A1 | 7/2009 | Brittain et al. |
| 2009/0190429 A1 | 7/2009 | Brittain et al. |
| 2009/0193200 A1 | 7/2009 | Brittain et al. |
| 2009/0193201 A1 | 7/2009 | Brittain et al. |
| 2009/0193203 A1 | 7/2009 | Brittain et al. |
| 2009/0193290 A1 | 7/2009 | Arimilli et al. |
| 2010/0269021 A1 | 10/2010 | Gower et al. |

OTHER PUBLICATIONS

U.S. Appl. No. 11/848,312.
U.S. Appl. No. 11/848,318.
U.S. Appl. No. 11/848,322.
U.S. Appl. No. 11/848,335.
U.S. Appl. No. 11/848,342.
U.S. Appl. No. 11/848,349.
U.S. Appl. No. 11/848,354.
U.S. Appl. No. 11/850,190.
U.S. Appl. No. 11/850,290.
U.S. Appl. No. 11/850,353.

U.S. Appl. No. 12/018,952.
U.S. Appl. No. 12/018,972.
U.S. Appl. No. 12/019,043.
U.S. Appl. No. 12/019,071.
U.S. Appl. No. 12/019,095.
U.S. Appl. No. 12/019,141.
U.S. Appl. No. 11/848,309, filed Aug. 31, 2007, Gower et al.
U.S. Appl. No. 11/850,190, filed Sep. 5, 2007, Gower et al.
U.S. Appl. No. 11/848,312, filed Aug. 31, 2007, Gower et al.
U.S. Appl. No. 11/850,290, filed Sep. 5, 2007, Gower et al.
U.S. Appl. No. 11/848,318, filed Aug. 31, 2007, Gower et al.
U.S. Appl. No. 11/848,322, filed Aug. 31, 2007, Gower et al.
U.S. Appl. No. 11/848,335, filed Aug. 31, 2007, Gower et al.
U.S. Appl. No. 11/848,342, filed Aug. 31, 2007, Gower et al.
U.S. Appl. No. 11/848,349, filed Aug. 31, 2007, Gower et al.
U.S. Appl. No. 11/850,353, filed Sep. 5, 2007, Gower et al.
U.S. Appl. No. 11/848,354, filed Aug. 31, 2007, Gower et al.
U.S. Appl. No. 12/019,071, filed Jan. 24, 2008, Brittain et al.
U.S. Appl. No. 12/019,043, filed Jan. 24, 2008, Brittain et al.
U.S. Appl. No. 12/019,095, filed Jan. 24, 2008, Brittain et al.
U.S. Appl. No. 12/018,952, filed Jan. 24, 2008, Brittain et al.
U.S. Appl. No. 12/019,141, filed Jan. 24, 2008, Arimilli et al.
U.S. Appl. No. 12/018,972, filed Jan. 24, 2008, Brittain et al.
Interview Summary dated Mar. 10, 2011 for U.S. Appl. No. 11/850,190; 3 pages.
Notice of Allowance mailed May 6, 2011 for U.S. Appl. No. 11/850,190; 11 pages.
Office Action mailed Apr. 27, 2011 for U.S. Appl. No. 11/848,354; 34 pages.
Office Action mailed Apr. 29, 2011 for U.S. Appl. No. 11/848,349; 31 pages.
Office Action mailed May 5, 2011 for U.S. Appl. No. 11/850,353; 32 pages.
Response to Office Action filed Mar. 23, 2011, U.S. Appl. No. 11/850,190, 24 pages.
"IEEE Standard for High-Bandwidth Memory Interface Based on Scalable Coherent Interface (SCI) Signaling Technology (RamLink)", IEEE Standard 1596.4-1996, SCI (RamLink) Technology, 4 pages.
Final Office Action mailed Jul. 2, 2010 for U.S. Appl. No. 11/848,335; 17 pages.
Interview Summary mailed Mar. 4, 2010 for U.S. Appl. No. 11/848,322; 3 pages.
Interview Summary mailed Apr. 5, 2010 for U.S. Appl. No. 11/848,318; 3 pages.
Interview Summary mailed Apr. 22, 2010 for U.S. Appl. No. 11/848,335; 3 pages.
Interview Summary mailed Jun. 1, 2010 for U.S. Appl. No. 11/848,309; 3 pages.
Interview Summary mailed Jun. 1, 2010 for U.S. Appl. No. 11/848,312; 3 pages.
Notice of Allowance mailed Mar. 24, 2010 for U.S. Appl. No. 12/019,141; 12 pages.
Notice of Allowance mailed Jun. 10, 2010 for U.S. Appl. No. 11/848,322; 10 pages.
Office Action mailed Mar. 5, 2010 for U.S. Appl. No. 11/848,309, 27 pages.
Response to Office Action filed Apr. 21, 2010 for U.S. Appl. No. 11/848,335; 29 pages.
Response to Office Action filed May 25, 2010 for U.S. Appl. No. 11/848,312; 12 pages.
Response to Office Action filed Jun. 3, 2010 for U.S. Appl. No. 11/848,309; 19 pages.
Response to Office Action filed Mar. 5, 2010 for U.S. Appl. No. 11/848,322, 14 pages.
Notice of Allowance mailed Jul. 15, 2010 for U.S. Appl. No. 11/848,318; 9 pages.
Notice of Allowance mailed Aug. 6, 2010 for U.S. Appl. No. 11/848,335; 5 pages.
Notice of Allowance mailed Aug. 16, 2010 for U.S. Appl. No. 11/848,312; 8 pages.
Notice of Allowance mailed Aug. 19, 2010 for U.S. Appl. No. 11/848,309; 15 pages.

Office Action mailed Aug. 31, 2010 for U.S. Appl. No. 12/019,071; 22 pages.
Office Action mailed Aug. 31, 2010 for U.S. Appl. No. 12/019,095; 21 pages.
Office Action mailed Sep. 1, 2010 for U.S. Appl. No. 12/019,043; 21 pages.
Office Action mailed Sep. 2, 2010 for U.S. Appl. No. 12/018,952; 21 pages.
Office Action mailed Sep. 29, 2010 for U.S. Appl. No. 12/018,972; 27 pages.
Alghazo, Jaafar et al., "SF-LRU Cache Replacement Algorithm", Records of the 2004 International Workshop on Memory Technology, Design and Testing (MTDT), Aug. 2004, 6 pages.
Delaluz, V. et al., "Scheduler-Based DRAM Energy Management", Proceedings of the 2002 Design Automation Conference (IEEE Cat. No. 02CH37324), Jun. 2002, pp. 697-702.
Huang, Hai et al., "Improving Energy Efficiency by Making DRAM Less Randomly Accessed", Proceedings of the 2005 International Symposium on Low Power Electronics and Design (IEEE Cat. No. 05th 8842), Aug. 2005, pp. 393-398.
Huang, Hai et al., "Method and System for Decreasing Power Consumption in Memory Array", Jul. 2005, 5 pages.
Park, Jin H. et al., "Coarse Grained Power Management", Proceedings of the International Conference on Embedded Systems and Applications, ESA, 2003, pp. 248-254.
U.S. Appl. No. 11/613,363, filed Dec. 20, 2006, Pham et al.
Nasr, Rami Marwan, "FBSIM and the Fully Buffered DIMM Memory System Architecture", Thesis, 2005, 138 pages.
Lin et al., "DRAM-Level Prefetching for Fully-Buffered DIMM: Design, Performance and Power Saving", ISPASS, 2007, pp. 1-36.
"Quad-Core and Dual-Core Intel Xeon Processor-based Two-Processor Workstations", Intel, see "fully buffered DIMM technology", Oct. 5, 2006, p. 8.
John, Lizy Kurian, "VaWiRAM: A Variable Width Random Access Memory Module", $9^{th}$ International Conference on VLSI Design, Jan. 1996, pp. 219-224.
Woodacre et al., "The SGI Altix 3000 Global Shared-Memory Architecture", Silicon Graphics, Incorporated, White Paper, 2003.
Haas et al., "Fully-Buffered DIMM Technology Moves Enterprise Platforms to the Next Level", Technology @ Intel Magazine, Mar. 2005, pp, 1-7.
Arimilli et al., "Asynchronous Generation of DRAM Controls from Micro Channel Signals", IBM Technical Disclosure, No. 6, 1992, p. 372.
Howell, J.H., "Dual-Port Control Signal Generator", IBM Technical Disclosure, 1988, pp. 102-104.
Karp et al., "Clock Synchronization Method Speeds Processor Access to Memory", IBM Technical Disclosure, yvol. 38, No. 11, 1995, pp. 7-8.
Notice of Allowance mailed Dec. 3, 2010 for U.S. Appl. No. 12/018,972; 5 pages.
Notice of Allowance mailed Dec. 3, 2010 for U.S. Appl. No. 12/019,071; 5 pages.
Notice of Allowance mailed Dec. 6, 2010 for U.S. Appl. No. 12/019,043; 5 pages.
Notice of Allowance mailed Dec. 9, 2010 for U.S. Appl. No. 12/018,952; 5 pages.
Notice of Allowance mailed Dec. 9, 2010 for U.S. Appl. No. 12/019,095; 5 pages.
Office Action dated Dec. 23, 2010 for U.S. Appl. No. 11/850,190; 44 pages.
Response to Office Action filed with the USPTO on Oct. 28, 2010 for U.S. Appl. No. 12/018,952; 8 pages.
Response to Office Action filed with the USPTO on Oct. 28, 2010 for U.S. Appl. No. 12/018,972; 9 pages.
Response to Office Action filed with the USPTO on Oct. 28, 2010 for U.S. Appl. No. 12/019,043; 8 pages.
Response to Office Action filed with the USPTO on Oct. 28, 2010 for U.S. Appl. No. 12/019,071; 8 pages.
Response to Office Action filed with the USPTO on Oct. 28, 2010 for U.S. Appl. No. 12/019,095; 8 pages.

Final Office Action dated Aug. 19, 2011 for U.S. Appl. No. 11/850,353, 16 pages.
Interview Summary mailed Jul. 13, 2001 for U.S. Appl. No. 11/848,349; 4 pages.
Interview Summary mailed Jul. 15, 2011 for U.S. Appl. No. 11/848,354; 4 pages.
Interview Summmary mailed Jul. 25, 2011 for U.S. Appl. 11/850,353; 10 pages.
Interview Summary mailed Sep. 26, 2011 for U.S. Appl. No. 11/850,353; 3 pages.
Norice of Allowability mailed Jul. 14, 2011 for U.S. Appl. No. 11/850,190; 6 pages.
Notice of Allowance mailed Aug. 5, 2011 for U.S. Appl. No. 11/848,349; 8 pages.
Notice of Allowance mailed Aug. 19, 2011 for U.S Appl. No. 11/848,354; 7 pages.
Response to Office Action filed Jul. 21, 2011, U.S. Appl. No. 11/848,349; 22 pages.
Response to Office Action filed Jul. 21, 2011, U.S. Appl. No. 11/848,354; 28 pages.
Response of Office Action filed Aug. 1, 2011, U.S. Appl. No. 11/850,353, 21 pages.

* cited by examiner

SYSTEM FOR A COMBINED ERROR CORRECTION CODE AND CYCLIC REDUNDANCY CHECK CODE FOR A MEMORY CHANNEL

GOVERNMENT RIGHTS

This invention was made with United States Government support under Agreement No. HR0011-07-9-0002 awarded by DARPA. THE GOVERNMENT HAS CERTAIN RIGHTS IN THE INVENTION.

BACKGROUND

1. Technical Field

The present application relates generally to an improved data processing system and method. More specifically, the present application is directed to a system that provides a combined error correction code and cyclic redundancy check code for a memory channel.

2. Description of Related Art

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems, i.e. systems that must be available to users without failure for large periods of time, present further challenges related to overall system reliability due to customer expectations that new computer systems will markedly surpass existing systems with regard to mean-time-before-failure (MTBF), in addition to offering additional functions, increased performance, increased storage, lower operating costs, etc. Other frequent customer requirements further exacerbate the memory system design challenges, and include such items as ease of upgrade and reduced system environmental impact, such as space, power, and cooling.

Furthermore, with the movement to multi-core and multi-threaded processor designs, new requirements are being made for the memory subsystem to supply very large data bandwidths and memory capacity into a single processor memory module socket. At a system level, the bandwidth available from the memory subsystem is directly proportional to the number of memory channels that can be supported by the processor pin counts. However, in known memory subsystem designs, the memory channels have an inherent fail rate due to a number of failure mechanisms including but not limited to, contact fails between the pins of the memory module and the pins of the memory module socket, electrical noise on interface lines, driver/receiver failures, etc. The standard solution to resolve a memory access request failure due to one of these failure mechanisms is to have a cyclic redundancy check (CRC) code protect the data and have the memory controller retry the memory access request. Using CRC code protection works on transient failures but does not correct hard contact failure. Using CRC code protection also has a problem in that CRC code protection requires a significant amount of time to recover from an error on the memory channel and reissue all the memory access operations.

SUMMARY

The illustrative embodiments implement a solution to recover from channel errors with an error checking and correcting (ECC) code in place of the standard CRC code. To avoid adding additional bits lanes to a memory channel, the implemented ECC design uses the bits generally associated with CRC code and the spare bits for the ECC code bits. Using the bits associated with the CRC code and the spare bits may reduce the extra overhead generally associated with ECC code. Using the bits associated with the CRC code and the spare bits for ECC code may also leave the memory channel without any spare lanes, but using ECC code allows for a correction on the fly and better system performance due to the faster error recoverability. Using ECC code improves the recoverability at the system level and the system would run with ECC enabled until the first hard failure is detected.

The illustrative embodiments provide a memory hub device integrated in a memory module. The illustrative embodiments provide a link interface integrated in the memory hub device that provides a communication pathway between the memory hub device and an external memory controller. In the illustrative embodiments, first error correction logic integrated in the link interface performs error correction operations on first data that is received from the external memory controller via a first memory channel to be transmitted to a set of memory devices. In the illustrative embodiments, the first error correction logic generates a first error signal to the external memory controller in response to the first error correction logic detecting a first error in the first data. In the illustrative embodiments, a link interface control logic integrated in the link interface controls the transmission of the first data to the set of memory devices.

The illustrative embodiments may also comprise second error correction logic integrated in the link interface. In the illustrative embodiments, the second error correction logic may perform error correction operations on second data that is received from at least one of an additional memory hub device or standalone repeater hub device via a second memory channel to be transmitted to the external memory controller. In the illustrative embodiments, the second error correction logic may generate a second error signal to the external memory controller in response to the second error correction logic detecting the second error in the second data. In the illustrative embodiments, the link interface control logic may control the transmission of the second data to the external memory controller.

The illustrative embodiments may also comprise first error logic generation integrated in the link interface. In the illustrative embodiments, the first error logic generation may generate error correcting code bits on second data that is received from the memory hub device to be transmitted to the external memory controller. In the illustrative embodiments, the link interface control logic may control the transmission of the second data to the set of memory devices.

In the illustrative embodiments, the link interface may send the first data to a multiplexer. In the illustrative embodiments, the link interface control logic may signal the multiplexer to transmit the first data from receive logic in response to the first error correction logic failing to detect the first error in the first data. In the illustrative embodiments, the link interface control logic may signal the multiplexer to transmit the first error signal in response to the first error correction logic detecting the first error in the first data.

In the illustrative embodiments, the first error correction logic may check the first data from the external memory controller for errors using error code bits prior to transmitting the first data to the set of memory devices. In the illustrative embodiments, the second error correction logic may check the second data from the at least one of the additional memory hub device or the standalone repeater hub device for errors using error code bits prior to transmitting the second data to the external memory controller via the first memory channel.

In the illustrative embodiments, the link interface may send the second data to a multiplexer prior to transmitting the second data to the external memory controller. In the illustrative embodiments, the link interface control logic may signal the multiplexer to transmit the second data to the external memory controller along with the second error signal from the second error correction logic in response to the second error correction logic detecting the second error in the second data.

In the illustrative embodiments, the link interface may send the second data to a multiplexer prior to transmitting the second data to the external memory controller. In the illustrative embodiments, the link interface control logic may signal the multiplexer to transmit the second data to the external memory controller in response to the second error correction logic failing to detect the second error in the second data.

In the illustrative embodiments, the first error logic generation may generate an error correction codeword that is added to the second data before transmitting the second data to the external memory controller via the first memory channel. In the illustrative embodiments, the memory module may be one of a dual in-line memory module (DIMM) or a single in-line memory module (SIMM). In the illustrative embodiments, the memory module may be part of a data processing device.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

Figure 1:
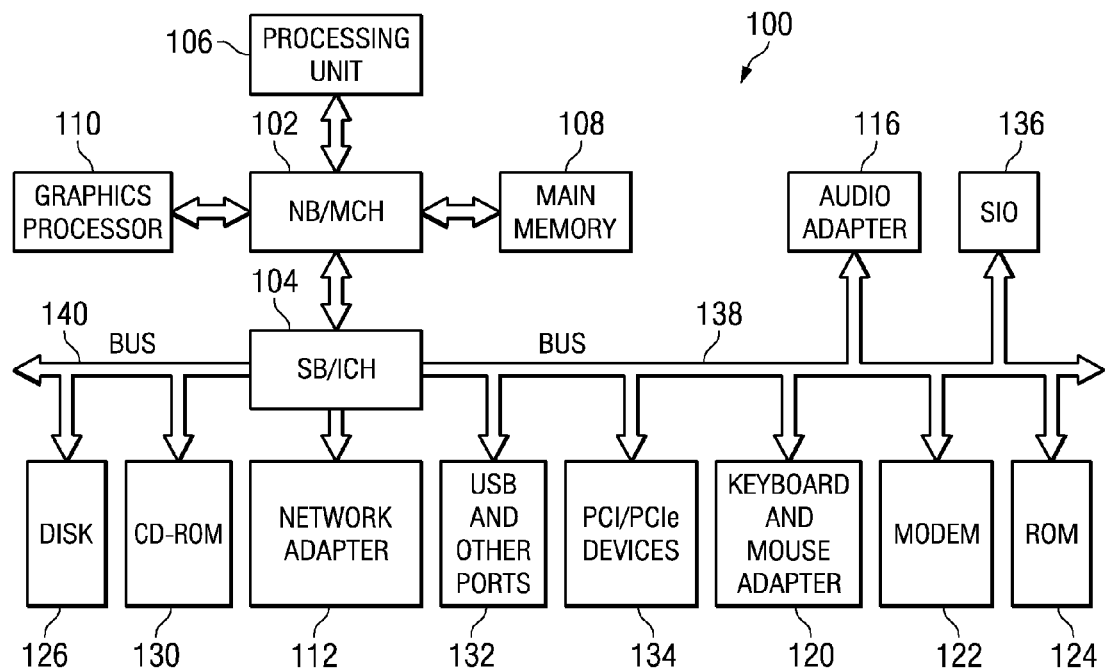
FIG. 1 is a block diagram of an exemplary data processing system in which aspects of the illustrative embodiments may be implemented.

The illustrative embodiments provide mechanisms for providing a combined error correction code and cyclic redundancy check code for a memory channel. As such, the mechanisms of the illustrative embodiments may be used with any of a number of different types of data processing devices and environments. For example, the memory subsystem of the illustrative embodiments may be utilized with data processing devices such as servers, client data processing systems, stand-alone data processing systems, or any other type of data processing device. Moreover, the memory subsystems of the illustrative embodiments may be used in other electronic devices in which memories are utilized including printers, facsimile machines, storage devices, flash drives, or any other electronic device in which a memory is utilized. In order to provide a context for the description of the mechanisms of the illustrative embodiments, and one example of a device in which the illustrative embodiments may be implemented, FIG. 1 is provided hereafter as an exemplary diagram of a data processing environment in which embodiments of the present invention may be implemented. It should be appreciated that FIG. 1 is only exemplary and is not intended to assert or imply any limitation with regard to the environments in which aspects or embodiments of the present invention may be implemented. Many modifications to the depicted environments may be made without departing from the spirit and scope of the present invention.

With reference now to FIG. 1, a block diagram of an exemplary data processing system is shown in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 100 (Java is a trademark of Sun Microsystems, Inc. in the United States, other countries, or both).

As a server, data processing system 100 may be, for example, an IBM® eServer™ System p™ computer system, running the Advanced Interactive Executive (AIX™) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. In other illustrative embodiments, data processing device 100 may be any type of digital commercial product that utilizes a memory subsystem in accordance with the illustrative embodiments, as discussed hereafter. For example, data processing device 100 may be a printer, facsimile machine, flash memory device, wireless communication device, game system, portable video/music player, or any other type of consumer electronic device. Essentially, data processing system 100 may be any known or later developed data processing system without architectural limitation.

Furthermore, data processing device 100 may employ many different types of memory for main memory 108. In some illustrative embodiments, main memory 108 may be a memory module, such as a dual in-line memory module (DIMM), single in-line memory module (SIMM), or other memory module or card structure. In general, a DIMM refers to a small circuit board or substrate that is comprised primarily of random access memory (RAM) integrated circuits, or dies, on one or both sides, i.e. planar surfaces, of the circuit board/substrate with signal and/or power pins along both sides of a common edge of the circuit board/substrate. A SIMM refers to a small circuit board or substrate composed primarily of RAM integrated circuits, or dies, on one or both sides, i.e. planar surfaces, of the circuit board/substrate and pins generally along both long edges, with each pin connected to the pin directly (or slightly offset from the pin) on the adjacent side.

As mentioned above, main memory 108 may be accessed by NB/MCH 102 using a memory channel, which is a high-frequency, high-bandwidth point-to-point interface, or other known interfaces such as multi-drop. Known memory channels connect a memory hub device of a buffered memory module to either NB/MCH 102 or another memory hub device of another buffered memory module. Memory channels have an inherent fail rate due to a number of failure mechanisms including but not limited to, contact fails between the pins of the memory module and the pins of the memory module socket, electrical noise on interface lines, driver/receiver failures, etc. These failures generally result in a bit lane error on the memory channel, where a single bit across the width of the memory channel will be incorrect. The failure rate is high enough that large high availability servers must have some method of detecting and recovering from such errors.

Known methods to correct bit lane errors is to have cyclic redundancy check (CRC) code detect the bit lane error and replace the failing bit lane with a spare bit lane on the memory channel. Although these known methods allow recovery from a bit lane error, the known methods introduce new issues. For example, the recovery time using CRC code is slow as a CRC code only indicates that a error has occurred somewhere on the memory channel. CRC code does not indicate which bit lane is in error. Since the location of the error is unknown, the memory channel operation that was in error will have to be reissued and if it completes correctly then the error was a transient failure and system operation will continue as normal. If the operation still fails, then a test pattern must be issued across the memory channel to determine the bit lane in error. The failing bit lane can then be replaced with a spare lane, and finally the sequence of failing commands can be reissued to the memory channel.

Thus, using CRC code detection may result in performance issues in the data processing system. In addition since a CRC code only detects and does not fix a failing bit lane, only transient failures on the memory channel are recoverable. A hard failure on a bit lane will bring down the system as the CRC code is not capable of correcting the failure. A high reliability server system requires that all errors be correctable and therefore must have additional spare bit lanes added to the memory channel to be used to fix a hard failure. A spare bit lane is an extra signal that is unused by the normal operation of the channel and is used to replace a failing bit lane once detected. The number of spare lanes necessary is dependent on the recoverability goals of the system. One spare lane will allow for recoverability of the first hard error but a second error will result in an unrecoverable system error. Additional spare lanes may be added to enhance the recoverability of the system. These spare lanes add to the cost of the system but they do not add to the functionality of the system until a failure has occurred.

Therefore, the illustrative embodiments provide mechanisms for error recovery of the memory channel on the memory module that would protect the memory channel using an error checking and correcting (ECC) code that can correct the bit lane errors on the fly without loss of performance in the data processing system. While the preferred embodiment is directed to a DIMM, the mechanisms described in the illustrative embodiment may be used with other memories, such as a SIMM, a memory card, a QUIMM (Quad inline memory module), or other carrier or assembly having electrical and dimensional attributes optimally suited for a given system environment.

In order to increase the reliability and performance of the memory subsystem, the illustrative embodiments implement a solution to recover from channel errors with an ECC code in place of the standard CRC code. In general an ECC code requires more channel bits to implement then a CRC code. For example, a CRC code may require 2 bit lanes for the code where an ECC code may require 4 bits for the code data. To avoid adding additional bits lanes to the memory channel, the ECC design uses the bits associated with the CRC code and the spare bits for the ECC code bits. Using the bits associated with the CRC code and the spare bits may reduce the extra overhead generally associated with ECC code. Using the bits associated with the CRC code and the spare bits for ECC code may leave the memory channel without any spare lanes, but using ECC code allows for a correction on the fly and better system performance due to the faster error recoverability. Using ECC code improves the recoverability at the system level and the system would run with ECC enabled until the first hard failure is detected. When the first hard failure is detected, the memory channel would be converted to a CRC code check, thereby releasing some number of bits for spare bits. The hard failure would then be spared out with one of the spare bits and the system would revert to a retry protocol on future channel errors.

In addition since the ECC code is a correcting code, the memory channel bit lanes may be monitored for errors and early detection of a failing connector pin. The early detection of a failing connector pin can be diagnosed by detection of a bit lane error rate above a predetermined level. Early detection of an error will allow the system to proactively request a replacement for a component in the memory system that is becoming marginal and potentially schedule a repair action before the memory system fails.

Figure 2:
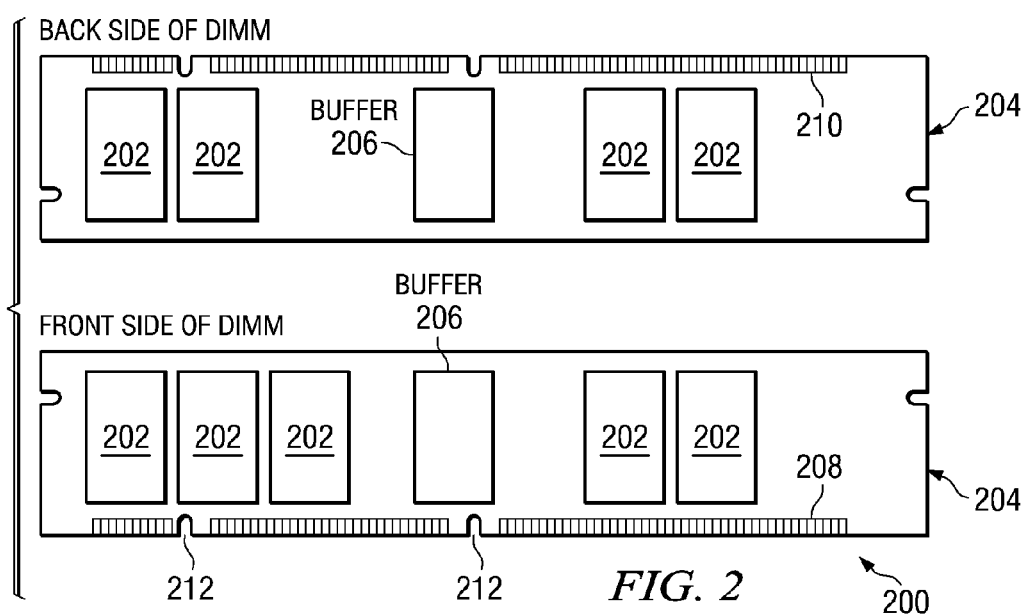
FIG. 2 depicts an exemplary synchronous memory module, such as a dual in-line memory module (DIMM)

FIG. 2 depicts an exemplary memory module, such as a dual in-line memory module (DIMM). Memory module 200 depicted in FIG. 2 may be part of main memory in a data processing device or system, such as main memory 108 in data processing system 100 of FIG. 1. Memory module 200 depicts a front planar side and a back planar side of a DIMM design for nine synchronous dynamic random access memory (SDRAM) chips 202, which may also be referred to as memory devices. In the depiction of FIG. 2, the backside view of the DIMM (top of drawing) may be rotated down such that the notches, or keys, on the edges are aligned with the notches, or keys, on the edges of the front side view of the DIMM (bottom of drawing).

In the depicted example, SDRAM chips 202 are arranged on the front and back sides of printed circuit board 204 with corresponding buffer 206 centrally disposed on each side. Thus, SDRAM chips 202 may be referred to as being disposed on a right side and a left side, relative to buffer 206, of the front side and on a right side and a left side, relative to buffer 206, of the back side. When viewed as an assembled memory module, connector pins 208 on the front side of printed circuit board 204 are disposed along a common edge with connector pins 210 on the back side of printed circuit board 204.

Keys 212 provide a positive mechanical interlock for systems solely supporting DRAM or SDRAM. In the exemplary embodiment, systems supporting both DRAM and SDRAM would have no connector key in this position. A side edge key may be used to inform the controller of the type of memory technology employed, e.g., flash write, EPROM, etc. or in other embodiments, may be used to identify operating voltage or other operational features for which a mechanical means is optimal to prevent system or module damage. Memory module 200 may be coupled to a memory controller of a data processing system, which controls the reading and writing of data from and to memory module 200. The DIMM depicted in FIG. 2 includes 168 pins in the exemplary illustration, whereas subsequent DIMMs may be constructed with pincounts ranging from 100 pins to over 300 pins, and in alternate exemplary embodiments, pins may be placed on more than one edge to permit interconnection to alternate interfaces (e.g. test, diagnostic, characterization, add-on memory/extended memory, etc).

Figure 3:
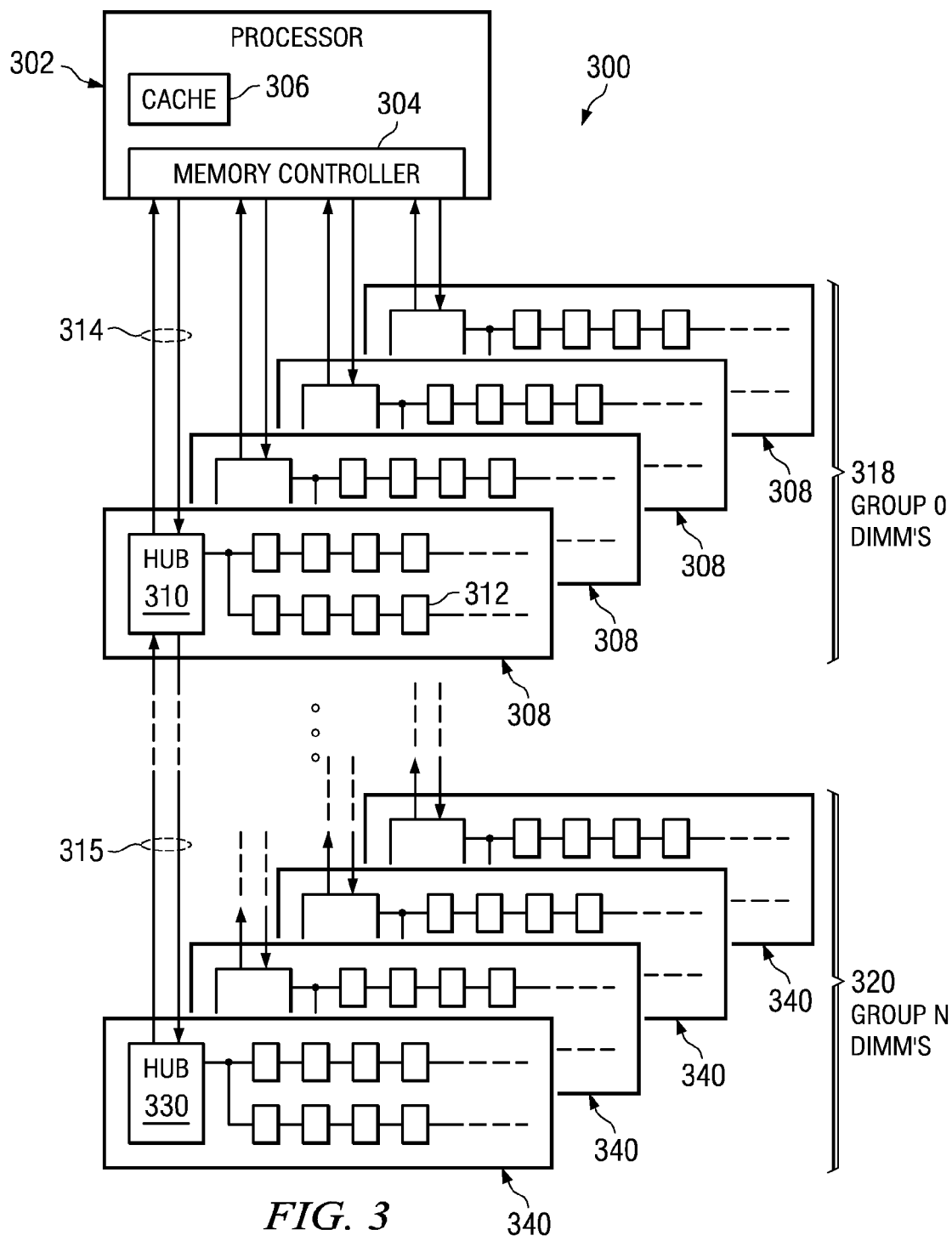
FIG. 3 illustrates an exemplary data processing system coupled to a subsystem of memory modules.

FIG. 3 illustrates an exemplary data processing system coupled to a subsystem of memory modules. Data processing system 300 includes processor 302, with memory controller 304 and cache 306 integrated thereon, and one or more memory modules 308, such as memory module 200 of FIG. 2. Each of the memory modules 308 may include a memory hub device 310 connected to one or more memory devices 312. Each of memory modules 308 connects via bus structures 314 or memory channels that are connected to processor 302 through a cascade interconnect bus structure, which may also be referred to as a hub-and-spoke topology. Memory controller 304 is interconnected to memory hub devices 310 of the memory modules 308 via one or more memory channels 314. Memory hub devices 310 may also be interconnected to other memory hub devices 330 of other memory modules 340 in an nth group of memory modules, such as module groups 318 or 320, or to a standalone repeater hub device using memory channel 315.

Each memory hub device 310 and 330 provides one or more low speed connection(s) to groups of memory devices 312 following, for example, the fully buffered DIMM standard. The connections to the memory devices may include both common and independent signals to the one or more memory devices, with the signals comprising one or more of data, address, command, control, status, reset, and other signals present in contemporary or future memory devices. Multiple identically configured memory modules 308 are logically grouped together into module groups 318 and 320, and may be operated on in unison or with a subset of the modules selected based on the commands issued by memory controller 304 to provide for optimal latency, bandwidth, and error correction effectiveness for system memory cache line transfer, diagnostics, and other communication modes to the memory storage.

In the exemplary embodiment, memory controller 304 translates system requests for memory access into packets according to a memory hub device communication protocol. Typically, memory write packets contain at least a command, address, and associated data. Memory read packets typically contain at least a command and address, and imply that an expected packet will be returned which contains the requested data and/or information related to the read request. Memory controller 304 sends the memory write packets and memory read packets to memory hub device 310 of a memory module 308. Memory hub device 310 routes the packets to a corresponding memory device 312 associated with memory hub device 310 or another memory hub device 330 of another memory module 340, or a standalone repeater hub device. The details of how memory hub device 310 may route the packets in this manner will be provided with reference to FIG. 4 hereafter.

Figure 4:
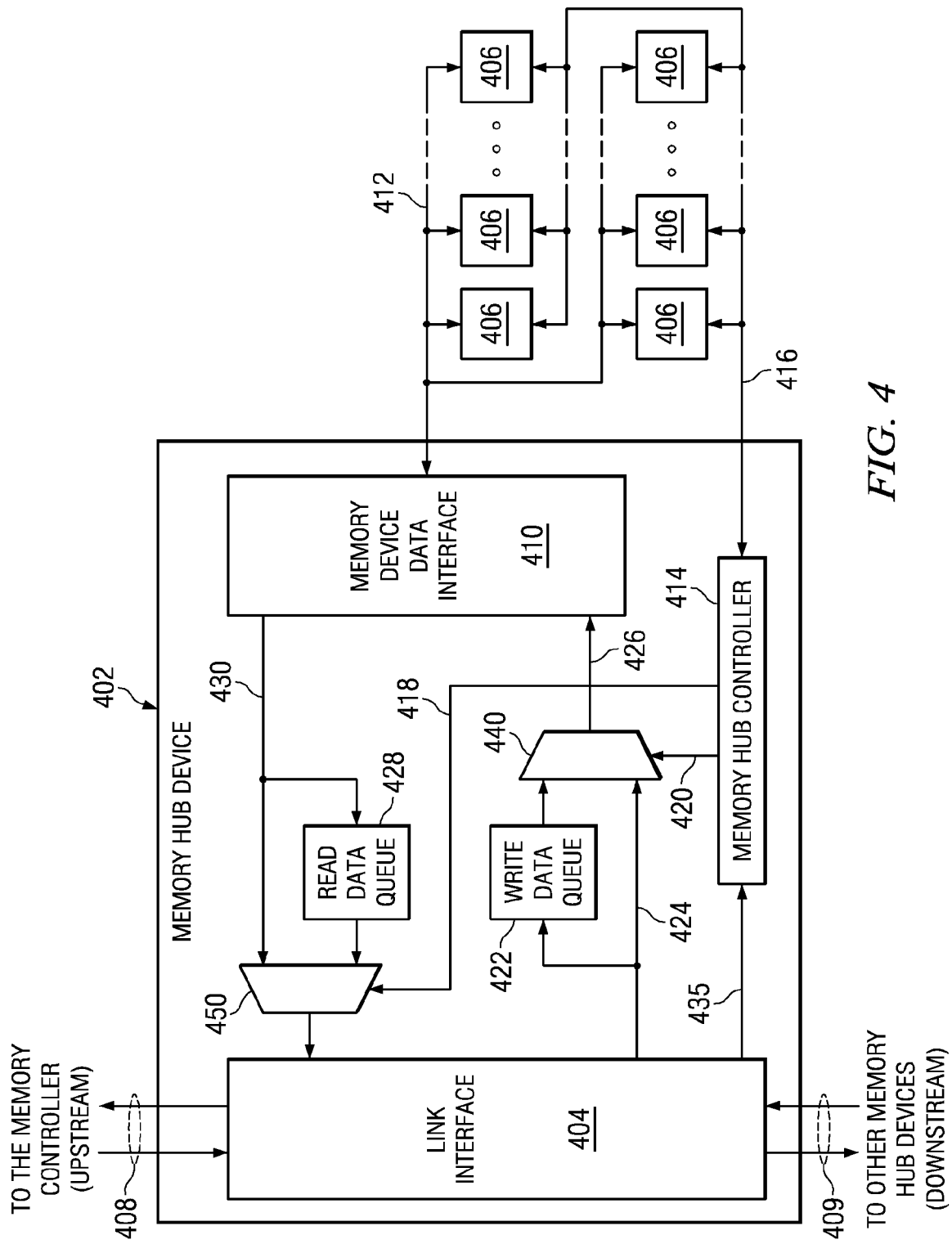
FIG. 4 depicts an exemplary block diagram of a memory hub device of a memory module.

FIG. 4 depicts an exemplary block diagram of a memory hub device of a memory module. Memory hub device 402, such as memory hub device 310 of FIG. 3, may be connected to a memory controller (not shown), such as memory controller 304 of FIG. 3, through memory channel 408, which may be a multi-drop bus structure, point-to-point bus structure, or the like, that may further include a cascade connection to one or more additional memory hub devices or a standalone repeater hub device. In the exemplary embodiment, memory channel 408 is a high bandwidth bus structure on which memory access requests are transmitted and received by the memory controller through the memory channel to and from memory hub device 402.

Exemplary memory hub device 402 comprises link interface 404 that receives high-speed memory access requests from an upstream or downstream memory hub device (not shown) or from a memory controller (not shown) via memory channel 408 or 409. Link interface 404 also provides the means to re-synchronize, translate, and re-drive high-speed memory access requests to memory devices 406 and/or to re-drive the high-speed memory access requests downstream or upstream on memory channel 409 as applicable using known memory system communication protocols. Link interface 404 may also receive read data packets from a downstream or upstream memory hub device (not shown) on memory channel 409. Link interface 404 may select between the read data packets from the downstream or upstream memory hub device and the data from memory devices 406 internal to memory hub device 402 using known memory system communication protocols, and then send the data upstream or downstream on memory channel 408.

Memory hub controller 414 responds to access request packets, i.e. write packets and read packets, by responsively driving memory devices 406 using memory device address and control bus 416. Memory hub controller 414 also controls data flow by directing read data flow selector 418 and write data flow selector 420. Link interface 404 decodes the data packets received from the memory controller and directs the address and command information to memory hub controller 414. Memory write data from link interface 404 may be temporarily stored in write data queue 422 before being provided to multiplexer 440. Alternatively, the memory write data may be directly driven to multiplexer 440 via internal bus 424. Memory hub controller 414 uses the address of the write data and control information from the write packet to control write data flow selector 420 and, thus, multiplexer 440 such that multiplexer 440 sends the memory write data from write data queue 422, where the address specific write data may be stored, or internal bus 424 if the address specific write data is sent directly from link interface 404. The memory write data may then be sent via internal bus 426 to memory device data interface 410. Memory device data interface 410 then sends the memory write data to memory devices 406 via memory device data bus 412. While all of memory devices 406 receive the write data, only the memory device having the address of the write data actually stores the write data.

Memory read data may also be provided from memory devices 406 to memory device data interface 410 via memory device data bus 412. Memory device data interface 410 may provide the memory read data to multiplexer 450 directly via internal bus 430 or indirectly via read data queue 428 and internal bus 430. Multiplexer 450 outputs data to link interface 404 using read data flow selector 418 under control of memory hub controller 414. Memory hub controller 414 uses the address of the read data to control read data flow selector 418 and, thus, multiplexer 450 so that multiplexer 450 sends memory read data from read data queue 428, where the address specific read data may be stored, or internal bus 430 if the address specific read data is to be sent directly to link interface 404. Link interface 404 may then transmit the memory read data upstream on memory channel 408 to a memory controller in a processor as one or more read reply packet(s).

In the exemplary embodiments, memory device data interface 410 is an eight-byte data interface that manages the technology-specific data interface with memory devices 406, and further controls the bi-directional memory device data bus 412. However, memory device data interface 410 may be comprised of more or less bytes based on the application requirements, alternate reliability structures (requiring more or less data bits), mechanical (and other) limitations or the like.

As an example of the command flow for a write command, when the memory controller, such as memory controller 304 of FIG. 3, issues a write command to memory devices 406 on memory hub device 402, the memory controller will transmit both a write command and write data to memory hub device 402 via memory channel 408. Link interface 404 decodes the address information associated with the write data and, if the write data is targeted to memory devices 406, link interface 404 moves the write data to a buffer in write data queue 422. The selection of a buffer may be determined in many ways, such as a first in first out queuing method, a buffer implicitly defined in the write command, or other buffer management implementation. Memory hub device 402 generally stores the write data in write data queue 422 prior to the write command being issued, but, depending on the protocol of memory devices 406 and memory channel 408, some or all of the write data may be transferred directly from link interface 404 to memory device data interface 410 via multiplexer 440 under control of memory hub controller 414 and write data flow selector 420. Memory hub controller 414 uses the address of the write data and write command to control write data flow selector 420 and, thus, multiplexer 440 so that multiplexer 440 sends the memory write data from write data queue 422, where the address specific write data may be stored, or internal bus 424 if the address specific write data is sent directly from link interface 404.

After the write data has been transferred, the memory controller will issue a write command to link interface 404 on memory channel 408. Control logic in link interface 404 will, in parallel, forward the write command to downstream memory hub devices on memory channel 409 and further decode the write command to determine if the write command is targeted at memory devices 406 attached to memory hub device 402. If the write command is targeted for memory devices 406, link interface 404 forwards the write command to memory hub controller 414 to be executed via internal bus 435. Memory hub controller 414 converts the write command into the correct protocols for memory devices 406 installed on memory module. Memory hub controller 414 sends the write command to memory devices 406 over memory device address and control bus 416. While all of memory devices 406 receive the write command, only the memory device with the address of the write data actually executes the write command. If the write data is stored in write data queue 422, memory hub controller 414 transfers, at an appropriate time, the write data from write data queue 422 to memory device data interface 410 using write data flow selector 420. Memory device data interface 410 forwards the write data to memory devices 406 on memory device data bus 412.

An example of the command flow for a read command, when memory hub device 402 receives a read command on memory channel 408, control logic in link interface 404 will, in parallel, forward this read command to any downstream memory hub device on memory channel 409, and further decode the read command to determine if the read command is targeted at memory device 406 attached to memory hub device 402. If link interface 404 determines that the read command is targeted for memory hub device 402, link interface 404 forwards the read command using internal bus 435 to memory hub controller 414 to be executed. Memory hub controller 414 converts the read command into the correct protocols for memory devices 406 installed on the memory module. Memory hub controller 414 then sends the read command to memory devices 406 over memory device address and control bus 416. While all of memory devices 406 receive the read command, only the memory device with the address of the read data actually executes the read command and sends the read data to memory device data interface 410. Memory devices 406 execute the read command and transfer a read data packet to memory device data interface 410 over memory device data bus 412.

Under control of memory hub controller 414, memory device data interface 410 transfers the read data packet to either read data queue 428 or directly to link interface 404 to be transferred back to the memory controller using memory channel 408. Memory hub controller 414 uses the address of the read data to control read data flow selector 418 and, thus, multiplexer 450 so that multiplexer 450 sends the memory read data from read data queue 428, where the address specific read data may be stored, or internal bus 430 if the address specific read data is to be sent directly to link interface 404. If the read data is stored in read data queue 428, memory hub controller 414 will decide when to move the stored data to link interface 404 depending on the state of read data queue 428 and the state of link interface 404. If there is already data in read data queue 428 pending transfer to link interface 404, then memory hub controller 414 directs the new read data to read data queue 428. Memory hub controller 414 directs data out of read data queue 428 in a first in, first out manner. Additionally, if link interface 404 is busy moving data from memory channel 409, then memory hub controller 414 delays the transfer of read data until there is an opening on memory channel 408. Any known method may be used to manage read data queue 428.

Figure 5:
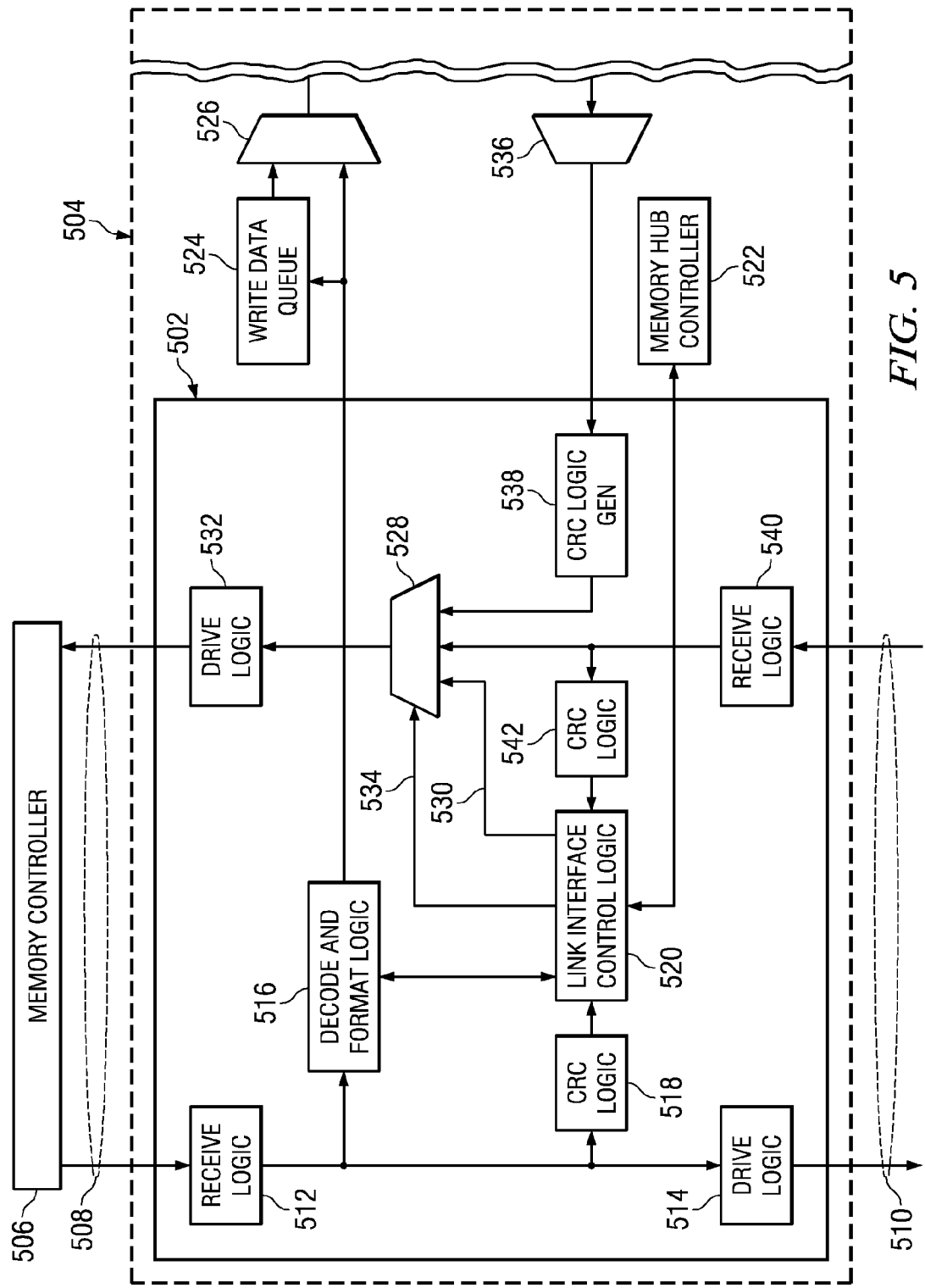
FIG. 5 depicts an exemplary block diagram of a link interface of a memory hub device in accordance with an illustrative embodiment.

FIG. 5 depicts an exemplary block diagram of a link interface of a memory hub device in accordance with an illustrative embodiment. Link interface 502, such as link interface 404 of FIG. 4, is within memory hub device 504, such as memory hub device 402 of FIG. 4. Link interface 502 may be connected to memory controller 506, such as memory controller 304 of FIG. 3, through memory channel 508 that may further include a cascade connection, denoted as memory channel 510, to one or more additional downstream memory hub devices or a standalone repeater hub device.

Link interface 502 receives a memory access command from memory controller 506 via memory channel 508. The memory access command includes command information and code bits for the error checking logic. In this example, the code bits are cyclic redundancy check (CRC) code bits. Receive logic 512 in link interface 502 forwards the memory access command to drive logic 514 for transmission to one or more of the additional downstream memory hub devices or the standalone repeater hub device via memory channel 510. While receive logic 512 sends the command information to drive logic 514, receive logic 512 also sends the command information to decode and format logic 516 and to CRC logic 518. CRC logic 518 may check the command packets for errors by regenerating the CRC code bits using the same CRC algorithm that was initially used in memory controller 506 to generate the transmitted bits. For CRC logic 518 to check the command packets for errors, the transmitted bits in the command packet are run through the CRC code generation logic in CRC logic 518 and then the resulting CRC code bits may be compared to the CRC code bits sent with the command. If the CRC code bits are the same, then there is no detectable error in the transmitted packet. If the CRC code bits are not the same, then the transmitted packet contains an error and is invalid.

If CRC logic 518 fails to detect any errors, then decode and format logic 516 decodes and formats the command information and sends the command information to link interface control logic 520. If link interface control logic 520 determines that the command information indicates that the memory access command is targeted to memory hub device 504, link interface control logic 520 sends the formatted command information to memory hub controller 522. At the same time, if the memory access command is a write command, link interface control logic 520 sends control signals to decode and format logic 516, so that decode and format logic 516 sends the write data to write data queue 524 or write data multiplexer 526. If CRC logic 518 detects an error, then link interface control logic 520 sends the error to memory controller 506 via internal bus 530, multiplexer 528, and drive logic 532 under the control of selector 534. Link interface control logic 520 then discards the memory access command.

Link interface 502 may also receive data packets via memory channel 510 or read multiplexer 536. If the received data packet is from read multiplexer 536, then CRC logic generator 538 generates the code bits for the data in the data packet. Memory hub controller 522 sends a signal to link interface control logic 520 that a data packet is ready to be transmitted to memory controller 506. Link interface control logic 520 then sends a signal to multiplexer 528 using selector 534 so that the data may be transferred to memory controller 506 by drive logic 532. If receive logic 540 receives a data packet via memory channel 510, the data packet will include the data to be transferred to memory controller 506 and code bits for error checking and correction of the data. This data packet will be forwarded directly from receive logic 540 through multiplexer 528 using selector 534 so that the data may be transferred to memory controller 506 by drive logic 532. As the data passes through link interface 502, CRC logic 542 checks the data for errors. If CRC logic 542 detects an error in the data, CRC logic 542 logs the error in an internal status register that may be used by memory controller 506 to isolate a CRC error received by memory controller 506 to the correct memory hub.

When a CRC error occurs within the memory system, either on the memory access command transmission to memory hub device 504 or on the transmission of read data back to memory controller 506, the memory access command associated with the error will have to be reissued to attempt to get the correct result. Since the CRC logic 518 and 542 checks for errors and cannot correct any errors, memory controller 506 has no knowledge at this point to where the error occurred or if the error is a transient error or a hard error. At this point, memory controller 506 reissues the memory access command on memory channel 508 and, if the memory access command executes properly this time, memory controller 506 logs the error as a transient error on memory channel 508. However, if the memory access command again fails to execute properly, then memory controller 506 will log the error as a hard failure. At this point, if there are available spare signal lanes on the memory channel 508, memory controller 506 will attempt to repair the failure. Since the CRC code cannot indicate which bit lane has failed, memory controller 506 will first determine the failing bit lane before it can repair the fault. To do so, memory controller 506 sends a series of test patterns down memory channel 508 to determine which bit lane is at fault. Once memory controller 506 determines the failing bit lane, the spare signal lane will be used to repair memory channel 508 and then the failing memory access command will be reissued. If the test patterns issued by memory controller 506 fail to determine which bit lane is in error, then memory channel 508 will have to be disabled and removed from the computer system.

Thus, the illustrative embodiments provide mechanisms for increasing the reliability and performance of the memory subsystem by managing memory device error correction of a memory channel within a memory hub device. The illustrative embodiments implement a solution to recover from memory channel errors with an ECC code in place of the standard CRC code. In general, an ECC code requires more memory channel bits to implement than a CRC code. For example, a CRC code may require 2 bit lanes for the code where an ECC code may require 4 bits for the code data. To avoid adding additional bits lanes to the memory channel, the ECC design uses the bits associated with the CRC code and the spare bits for the ECC code bits. Using the bits associated with the CRC code and the spare bits may reduce the extra overhead generally associated with ECC code. Using the bits associated with the CRC code and the spare bits for ECC code may leave the memory channel without any spare lanes, but using ECC code allows for a correction on the fly and better system performance due to the faster error recoverability. Using ECC code improves the recoverability at the system level and the system would run with ECC enabled until the first hard failure is detected. When the first hard failure is detected, the memory channel would be converted to a CRC code check, thereby releasing some number of bits for spare bits. The hard failure would then be spared out with one of the spare bits and the system would revert to a retry protocol on future channel errors.

In addition, since the ECC code is a correcting code, the memory channel bit lanes may be monitored for errors and early detection of a failing connector pin. The early detection of a failing connector pin may be diagnosed by detection of a bit lane error rate above a predetermined level. Early detection of an error will allow the system to proactively request a replacement for a failing component in the memory system that is becoming marginal and potentially schedule a repair action before the memory system fails.

Figure 6:
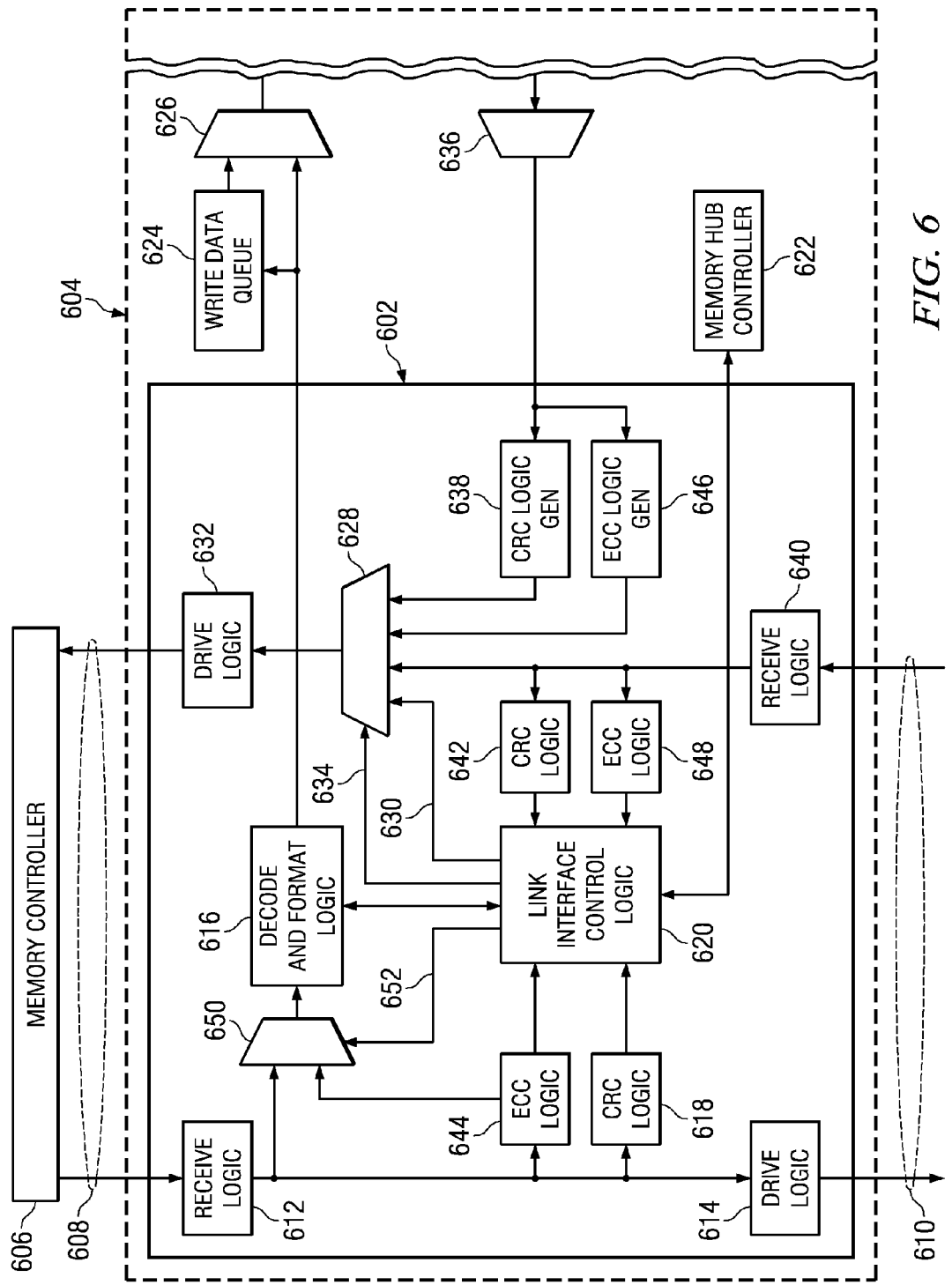
FIG. 6 depicts an exemplary block diagram of a link interface of a memory hub device that includes an ECC code solution in accordance with one illustrative embodiment.

FIG. 6 depicts an exemplary block diagram of a link interface of a memory hub device that includes an ECC code solution in accordance with one illustrative embodiment. Link interface 602 includes, in addition to the elements particular to the illustrative embodiments, elements that are similar to elements depicted in link interface 502 of FIG. 5. Thus, elements in FIG. 6 that are not specifically described as operating differently from elements in FIG. 5 are intended to operate in a similar manner as their corresponding elements in FIG. 5. For example, link interface 602 includes decode and format logic 616, link interface control logic 620, and memory channels 608 and 610, each of which operate in a similar manner to that described with the corresponding elements in FIG. 5. However, in this implementation, link interface 602 also includes error checking and correcting (ECC) logic 644, ECC logic generator 646, and ECC logic 648. As with link interface 502 of FIG. 5, link interface 602 may be connected to memory controller 606 through memory channel 608 that may further include a cascade connection, denoted as memory channel 610, to one or more additional downstream memory hub devices or a standalone repeater hub device.

Link interface 602 receives a memory access command from memory controller 606 via memory channel 608. The memory access command may include command information and code bits for error checking and correction logic. In this example, the code bits may be ECC code bits or cyclic redundancy check (CRC) code bits depending on the operating mode of memory hub device 604. In this example, memory hub device 604 is operating in an ECC mode to begin with by using the bit lanes of memory channel 608 that are generally defined for CRC code, when memory hub device 604 is operating in CRC mode, and the spare lanes available on memory channel 608 for failover. Receive logic 612 in link interface 602 forwards the memory access command to drive logic 614 for transmission to one or more of the additional downstream memory hub devices or the standalone repeater hub device via memory channel 610. While receive logic 612 sends the command information to drive logic 614, receive logic 612 also sends the command information and code bits to ECC logic 644. ECC logic 644 checks the command packets for errors by regenerating the ECC code bits using the same ECC algorithm that was initially used in memory controller 606 to generate the transmitted bits.

To do this, the transmitted bits in the command packet are run through the ECC code generation logic in ECC logic 644 and the resulting ECC code bits are compared to the ECC code bits sent with the memory access command. If the ECC code bits are the same, then there is no detectable error in the transmitted packet. However, if the ECC code bits are not the same, then the transmitted packet contains an error. ECC logic 644 then determines if the error detected is a correctable error or if it is an uncorrectable error. ECC codes have the capability to correct a subset of the possible errors and detect the remaining errors. If the detected error is correctable, the command packet will be corrected by ECC logic 644. If the detected error is uncorrectable, ECC logic 644 logs the command packet as an invalid packet.

If ECC logic 644 fails to detect any errors or if the errors detected are correctable, then ECC logic 644 signals link interface control logic 620 that the command packet is valid and forwards the corrected command packet from ECC logic 644 or the non-errored command packet directly from receive logic 612 through multiplexer 650 via selector 652 to decode and format logic 616. Decode and format logic 616 decodes and formats the command information and sends the command information to link interface control logic 620. If link interface control logic 620 determines that the command information indicates that the memory access command is targeted to memory hub device 604, link interface control logic 620 sends the formatted command information to memory hub controller 622. At the same time, if the memory access command is a write command, link interface control logic 620 sends control signals to decode and format logic 616, so that decode and format logic 616 sends the write data to write data queue 624 or write data multiplexer 626.

However, if ECC logic 644 detects an uncorrectable error, ECC logic 644 sends a signal to link interface control logic 620 indicating that the command packet is invalid. Link interface control logic 620 sends the error to memory controller

606 via internal bus 630, multiplexer 628, and drive logic 632 under the control of selector 634. Link interface control logic 620 then discards the memory access command. Thus, with ECC logic 644, errors in the command information received from memory controller 606 may be corrected on the fly with little or no performance impact on memory channel 608.

Again, as with link interface 502 of FIG. 5, link interface 602 may also receive data packets via memory channel 610 or read multiplexer 636. If the received data packet is from read multiplexer 636, then the operating mode of memory hub device 604 determines if the code bits for the incoming data are generated by ECC logic generator 646 or CRC logic generator 638. Again, in this example memory hub device 604 is operating in an ECC mode to begin with. Therefore, ECC logic generator 646 generates the code bits for the data in the data packet. Memory hub controller 622 sends a signal to link interface control logic 620 that a data packet is ready to be transmitted to memory controller 604. Link interface control logic 620 then sends a signal to multiplexer 628 using selector 634 so that the data may be transferred to memory controller 604 by drive logic 632.

If receive logic 640 receives a data packet via memory channel 610, the data packet will include the data to be transferred to memory controller 604 and code bits for error checking and correction of the data. The operating mode of memory hub device 604 determines if the incoming data is checked for errors by ECC logic 648 or CRC logic 642. In this example, memory hub device 604 is operating in an ECC mode to begin with. Therefore, as the data passes through link interface 602, ECC logic 648 checks the data for errors. This data packet will be forwarded directly from receive logic 640 through multiplexer 628 using selector 634 so that the data may be transferred to memory controller 606 by drive logic 632. As the data passes through link interface 602, ECC logic 648 checks the data for errors. If ECC logic 648 detects an error in the data, ECC logic 648 logs the error in an internal status register that may be used by memory controller 606 to determine if there are any bit lanes that have failed and if it is necessary to spare out failing bit lanes. Optionally, the data path through memory hub device 604 may be from receive logic 640 through ECC logic 648, through link interface control logic 620 and forwarded to multiplexer 628 via internal bus 630. The data would be selected using selector 634 by link interface control logic 620 through multiplexer 628 and sent to memory controller 606 by drive logic 632. This path, although higher in latency than the direct path through the chip, corrects errors from downstream hubs so that multiple memory channels may not combine errors together that may result in an uncorrectable error in memory controller 606.

When a correctable ECC error occurs within the memory system, either on the command transmission to memory hub device 604 or on the transmission of read data back to memory controller 606, the error may be logged by memory controller 606. This data will be used to determine if there is a potential failing bit lane in the memory system. Over time, memory controller 606 will track all errors on memory channel 608 and if the fail rate of any individual channel bit is higher then a predetermined setting, then memory controller 606 will proactively call out the memory device on which memory hub device 604 resides for replacement in the memory system. Such early detection may allow the data processing system to proactively request a replacement for the failing component in the memory system and potentially get the repair action scheduled in before the memory system fails. If memory controller 606 determines that the failure is a hard failure, for example if every access has the same bit lane failure, then memory controller 606 may proactively switch to CRC mode and use one of the bit lanes freed up by the change to spare out the bad lane.

When an uncorrectable ECC error occurs within the memory system, either on the command transmission to memory hub device 604 or on the transmission of read data back to memory controller 606, the memory access command associated with the error will have to be reissued to attempt to get the correct result. Memory controller 606 will at this point reissue the memory access command on memory channel 608 and, if the command executes properly this time, memory controller 606 logs the error as a transient error on memory channel 608. If the memory access command again fails to execute properly, then memory controller 606 logs the error as a hard failure. At this point, if there are available spare signal lanes on memory channel 608, memory controller 606 attempts to repair the failure. Since the ECC code cannot indicate which bit lane has failed, memory controller 606 has to determine the failing bit lane before it can repair the fault. To do so, memory controller 606 sends a series of test patterns down memory channel 608 to determine which bit lane is at fault. Once memory controller 606 determines the failing bit lane, memory controller 606 switches memory channel protection to CRC mode and uses one of the spare wires to repair memory channel 608. Memory controller 606 then reissues the failing command. If the test patterns issued by memory controller 606 fail to determine which bit lane is in error, then memory controller 606 disables memory channel 608 and removes memory channel 608 from the computer system.

Once the initial hard failure occurs, the ECC logic may no longer be able to correct an error on memory channel 608. If another bit lane fails then any further failure will not be correctable. To improve detection of future failures beyond two bit lanes failing, memory hub device 604 changes operating mode from the ECC mode described in FIG. 6 to the CRC mode described in FIG. 5 so that memory channel 608 may still be monitored for further errors by CRC logic 618 and 642. Depending on the number of signal lanes used for the ECC code versus the CRC code, additional detected failures may be spared out once in the CRC mode. Once the number of non-signal lanes is reduced to the point that there are no spares along with the CRC code bits, then a field service call becomes a high priority call to replace the failing component as any future hard failure will not be recoverable.

In another embodiment, when a data processing system considers reliability more important than bandwidth, the memory system may still be able to recover after all spare bit lanes have been used in the ECC mode previously described. In this mode, once there are no remaining spare bit lanes to replace failing bit lanes, the memory controller converts the bus protocol to a narrower protocol to free up additional spare bits to allow operations to continue at a reduced bandwidth level. This allows the memory channel to revert to a fully operational memory channel at a reduced data width, and continue system operation until a replacement can be made.

Therefore, implementing an ECC code solution that uses the memory channel bit lanes that are generally defined for the CRC code and the spare lanes to perform error correction may result in better performance while still providing the protection and recoverability of the base CRC protected channel. Using an ECC code solution, transient errors may now be corrected on the fly with no performance impact on the memory channel. In addition since the ECC code is a correcting code, the memory channel bit lanes may be monitored for errors and early detection of failing connector pins may be diagnosed by detection of a bit lane error rate above a predetermined level.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory system comprising:
a memory hub device integrated in a memory module; and
a link interface integrated in the memory hub device that provides a communication pathway between the memory hub device and an external memory controller, wherein the link interface comprises:
first error checking and correcting (ECC) logic integrated in the link interface and first cyclic redundancy check (CRC) logic integrated in the link interface, wherein:
the external memory controller sends first data to the link interface using ECC code bits thereby setting the memory hub device into an ECC mode when a plurality of memory bits lanes in a first memory channel are not experiencing failures above a predetermined level,
the external memory controller sends the first data to the link interface using CRC code bits thereby setting the memory hub device into a CRC mode when at least one of the memory bit lanes in the plurality of memory bits lanes in the first memory channel is experiencing failures above the predetermined level,
responsive to receiving the first data with the ECC code bits, the first ECC logic performs error correction operations on the first data that is received from the external memory controller via the first memory channel to be transmitted to a set of memory devices,
the first ECC logic generates a first error signal to the external memory controller in response to the first ECC logic detecting a first error in the first data,
responsive to receiving the first data with the CRC code bits, the first CRC logic performs error detection operations on the first data that is received from the external memory controller via the first memory channel to be transmitted to the set of memory devices, and
the first CRC logic generates the first error signal to the external memory controller in response to the first CRC logic detecting the first error in the first data; and
link interface control logic integrated in the link interface, wherein the link interface control logic controls the transmission of the first data to the set of memory devices.

2. The memory system of claim 1, wherein the link interface further comprises:
second ECC logic integrated in the link interface and second CRC logic integrated in the link interface, wherein:
responsive to receiving second data with the ECC code bits, the second ECC logic performs error correction operations on the second data that is received from at least one of an additional memory hub device or standalone repeater hub device via a second memory channel to be transmitted to the external memory controller,
the second ECC logic generates a second error signal to the external memory controller in response to the second error correction logic detecting the second error in the second data,
responsive to receiving the second data with the CRC code bits, the second CRC logic performs error detection operations on the second data that is received from the at least one of the additional memory hub device or the standalone repeater hub device via the second memory channel to be transmitted to the external memory controller,
the second CRC logic generates the second error signal to the external memory controller in response to the second CRC logic detecting the second error in the second data, and
the link interface control logic controls the transmission of the second data to the external memory controller.

3. The memory system of claim 1, wherein the link interface further comprises:
ECC logic generation integrated in the link interface and CRC logic generation integrated in the link interface, wherein:
responsive to memory hub device operating in the ECC mode, the ECC logic generation generates error correcting code bits on third data that is received from the set of memory devices coupled to the memory hub device to be transmitted to the external memory controller,
responsive to the memory hub device operating in the CRC mode, the CRC logic generation generates CRC bits on the third data that is received from the set of memo devices coupled to the memo hub device to be transmitted to the external memory controller, and
the link interface control logic controls the transmission of the second data to the set of memory devices.

4. The memory system of claim 1, wherein the link interface sends the first data to a multiplexer and wherein the link interface control logic signals the multiplexer to transmit the first data from receive logic in response to the first error correction logic failing to detect the first error in the first data.

5. The memory system of claim 1, wherein the link interface sends the first data to a multiplexer and wherein the link interface control logic signals the multiplexer to transmit the first error signal in response to the first error correction logic detecting the first error in the first data.

6. The memory system of claim 1, wherein the first error correction logic checks the first data from the external memory controller for errors using error code bits prior to transmitting the first data to the set of memory devices.

7. The memory system of claim 2, wherein, responsive to memory hub device operating in the ECC mode, the second ECC logic checks the second data from the at least one of the additional memory hub device or the standalone repeater hub device for errors using ECC code bits prior to transmitting the second data to the external memory controller via the first memory channel and wherein, responsive to memory hub device operating in the CRC mode, the second CRC logic checks the second data from the at least one of the additional memory hub device or the standalone repeater hub device for errors using CRC code hits prior to transmitting the second data to the external memory controller via the first memory channel.

8. The memory system of claim 5, wherein the link interface sends the second data to the multiplexer prior to transmitting the second data to the external memory controller, wherein, responsive to memory hub device operating in the ECC mode, the link interface control logic signals the multiplexer to transmit the second data to the external memory controller along with the second error signal from the second ECC logic in response to the second ECC logic detecting the second error in the second data, and wherein, responsive to memory hub device operating in the CRC mode, the link interface control logic signals the multiplexer to transmit the second data to the external memory controller along with the second error signal from the second CRC logic in response to the second CRC logic detecting the second error in the second data.

9. The memory system of claim 5, wherein the link interface sends the second data to the multiplexer prior to transmitting the second data to the external memory controller, wherein, responsive to memory hub device operating in the ECC mode, the link interface control logic signals the multiplexer to transmit the second data to the external memory controller in response to the second ECC logic failing to detect the second error in the second data, and wherein, responsive to memory hub device operating in the CRC mode, the link interface control logic signals the multiplexer to transmit the second data to the external memory controller in response to the second CRC logic failing to detect the second error in the second data.

10. The memory system of claim 3, wherein, responsive to memory hub device operating, in the ECC mode, the ECC logic generation generates an error correction codeword that is added to the third data before transmitting the third data to the external memory controller via the first memory channel and wherein, responsive to memory hub device operating in the CRC mode, the CRC logic generation generates A CRC codeword that is added to the third data before transmitting the third data to the external memory controller via the first memory channel.

11. The memory system of claim 1, wherein the memory module is one of a dual in-line memory module (DIMM) or a single in-line memory module (SIMM).

12. The memory system of claim 1, wherein the memory module is part of a data processing device.

13. A data processing system, comprising:
a processor; and
a memory coupled to the processor, wherein the memory comprises one or more memory modules, each memory module comprising:
a memory hub device integrated in the memory module; and
a link interface integrated in the memory hub device that provides a communication pathway between the memory hub device and an external memory controller, wherein the link interface comprises:
first error checking and correcting (ECC) logic integrated in the link interface and first cyclic redundancy check (CRC) logic integrated in the link interface, wherein:
the external memory controller sends first data to the link interface using ECC code bits thereby setting the memory hub device into an ECC mode when a plurality of memory bits lanes in a first memory channel are not experiencing failures above a predetermined level,
the external memory controller sends the first data to the link interface using CRC code bits thereby setting the memory hub device into a CRC mode when at least one of the memory bit lanes in the plurality of memory bits lanes in the first memory channel is experiencing failures above the predetermined level,
responsive to receiving the first data with the ECC code bits, the first ECC logic performs error correction operations on the first data that is received from the external memory controller via the first memory channel to be transmitted to a set of memory devices,
the first ECC logic generates a first error signal to the external memory controller in response to the first ECC logic detecting a first error in the first data,
responsive to receiving the first data with the CRC code bits, the first CRC logic performs error detection operations on the first data that is received from the external memory controller via the first memory channel to be transmitted to the set of memory devices, and
the first CRC logic generates the first error signal to the external memory controller in response to the first CRC logic detecting the first error in the first data; and
link interface control logic integrated in the link interface, wherein the link interface control logic controls the transmission of the first data to the set of memory devices.

14. The data processing system of claim 13, wherein the link interface further comprises:
second ECC logic integrated in the link interface and second CRC logic integrated in the link interface, wherein:
responsive to receiving second data with the ECC code bits, the second ECC logic performs error correction operations on the second data that is received from at least one of an additional memory hub device or standalone repeater hub device via a second memory channel to be transmitted to the external memory controller,
the second ECC logic generates a second error signal to the external memory controller in response to the second error correction logic detecting the second error in the second data,
responsive to receiving the second data with the CRC code bits, the second CRC logic performs error detection operations on the second data that is received from the at least one of the additional memory hub device or the standalone repeater hub device via the second memory channel to be transmitted the external memory controller,
the second CRC logic generates the second error signal to the external memory controller in response to the second CRC logic detecting the second error in the second data, and
the link interface control logic controls the transmission of the second data to the external memory controller.

15. The data processing system of claim 13, wherein the link interface further comprises:
ECC logic generation integrated in the link interface and CRC logic generation integrated in the link interface, wherein:
responsive to memory hub device operating in the ECC mode, the ECC logic generation generates error correcting code bits on third data that is received from the set of memory devices coupled to the memory hub device to be transmitted to the external memory controller,
responsive to memory hub device operating in the CRC mode, the CRC logic generation generates CRC bits on the third data that is received from the set of memory devices coupled to the memory hub device to be transmitted to the external memory controller, and
the link interface control logic controls the transmission of the second data to the set of memory devices.

16. The data processing system of claim 13, wherein the link interface sends the first data to a multiplexer and wherein the link interface control logic signals the multiplexer to transmit the first data from receive logic in response to the first error correction logic failing to detect the first error in the first data.

17. The data processing system of claim 13, wherein the link interface sends the first data to a multiplexer and wherein the link interface control logic signals the multiplexer to transmit the first error signal in response to the first error correction logic detecting the first error in the first data.

18. The data processing system of claim 13, wherein the first error correction logic checks the first data from the external memory controller for errors using error code bits prior to transmitting the first data to the set of memory devices.

19. The data processing system of claim 14, wherein, responsive to memory hub device operatic in the ECC mode, the second ECC logic checks the second data from the at least one of the additional memory hub device or the standalone repeater hub device for errors using ECC code bits prior to transmitting the second data to the external memory controller via the first memory channel and wherein, responsive to memory hub device operating in the CRC mode, the second CRC logic checks the second data from the at least one of the additional memory hub device or the standalone repeater hub device for errors using CRC code bits prior to transmitting the second data to the external memory controller via the first memory channel.

20. A method for performing error correction operations in a memory module, comprising:
　　receiving, by a link interface in a memory hub device integrated in the memory module, an access request from an external memory controller for accessing a set of memory devices of the memory module coupled to the memory hub device, wherein the link interface error comprises error checking and correcting (ECC) logic integrated in the link interface and cyclic redundancy check (CRC) logic integrated in the link interface, wherein the external memory controller sends data to the link interface using ECC code bits thereby setting the memory hub device into an ECC mode when a plurality of memory bits lanes in a memory channel are not experiencing, failures above a predetermined level, and wherein the external memory controller sends the data to the link interface using CRC code bits thereby setting the memory hub device into a CRC mode when at least one of the memory bit lanes in the plurality of memory bits lanes in the memory channel is experiencing failures above the predetermined level;
　　responsive to receiving the data with the ECC code bits, performing, by the ECC logic, one or more error correction operations on the data that is received from the external memory controller via the memory channel to be transmitted to the set of memory devices, wherein the ECC logic generates an error signal to the external memory controller in response to the ECC logic detecting an error in the data;
　　responsive to receiving the data with the CRC code bits, performing, by the CRC logic, one or more error detection operations on the data that is received from the external memory controller via the memory channel to be transmitted to the set of memory devices, wherein the CRC logic generates the error signal to the external memory controller in response to the CRC logic detecting the error in the data; and
　　controlling, by link interface control logic integrated in the link interface, the transmission of the data to the set of memory devices.

\* \* \* \* \*